United States Patent [19]

Corfield et al.

[11] Patent Number: 4,682,323
[45] Date of Patent: Jul. 21, 1987

[54] INTERCONNECTING INTEGRATED CIRCUITS

[75] Inventors: Kenneth G. Corfield, Hampstead; John S. Heeks, Harlow, both of England

[73] Assignee: Standard Telephones and Cables Public Limited Company, London, England

[21] Appl. No.: 723,491

[22] Filed: Apr. 12, 1985

[30] Foreign Application Priority Data

Apr. 14, 1984 [GB] United Kingdom ................. 8409751

[51] Int. Cl.⁴ .............................................. H04B 9/00
[52] U.S. Cl. ....................................... 370/4; 455/607; 455/612
[58] Field of Search .................... 370/3, 4, 1; 455/601, 455/606, 607, 612; 350/96.11

[56] References Cited

U.S. PATENT DOCUMENTS 4,393,515  7/1983  de Neumann ............................ 370/4
4,568,931  2/1986  Biolley et al. ......................... 455/607

FOREIGN PATENT DOCUMENTS 0019234  11/1980  European Pat. Off. .
57-87635   6/1982  Japan ....................... 370/3
58-42333   3/1983  Japan ....................... 455/612
961049     6/1964  United Kingdom .
2101828    1/1983  United Kingdom .
2125620    3/1984  United Kingdom .
2069196    3/1984  United Kingdom .

OTHER PUBLICATIONS

Bar-Chaim et al-Integrated Optoelectronics-IEEE Spectrum, May 1982, pp. 38-45.
Ephraim et al-Transceiver Module Assembly-IBM Tech. Discl. Bulletin-vol. 22, No. 5, Oct. 1979, pp. 2077-2078.
Bachtold-Integrated Bidirectional Fiber Optic Repeater-IBM Tech. Discl. Bulletin-vol. 23, No. 11, pp. 5145-5146.

*Primary Examiner*—Joseph A. Orsino, Jr.
*Attorney, Agent, or Firm*—Kerkam, Stowell, Kondracki & Clarke

[57] ABSTRACT

Connection into and out of digital integrated circuits is made optically, the input being implemented by flood-lighting appropriately placed photodiodes at the input points and the output by on chip commutative switching of the connect centers onto a common output pad which drives a light emitting source. Communicating chips are synchronously clocked at the commutation rate to achieve required interconnect configuration via time division multiplexing.

9 Claims, 1 Drawing Figure

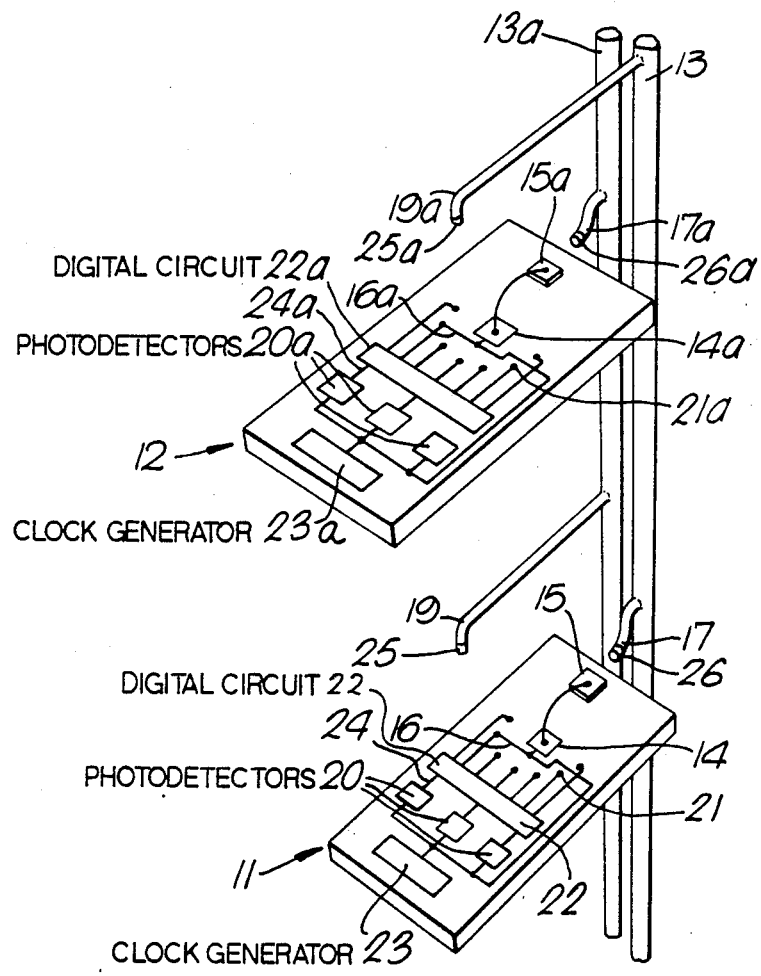

INTERCONNECTING INTEGRATED CIRCUITS

This invention relates to techniques for providing signal paths between integrated circuits and to circuit arrangements employing such techniques.

Signal paths between integrated circuits, e.g. in a computer or a telephone exchange, are conventionally provided by wired connections. As the complexity of integrated circuits is increased an increasing number of circuit input and output pads is required for these interconnections. Each path requires a relatively large chip area and a large number of such pads thus reduces the chip space available for active devices.

The object of the present invention is to minimise or to overcome this disadvantage.

According to one aspect of the invention there is provided an integrated circuit or circuit device having one or more signal outputs at least one of which is provided with means for generating an optical or infra-red carrier modulated with an output signal.

According to another aspect of the invention there is provided a digital circuit assembly, comprising a plurality of integrated circuits each having means for multiplexing output signals on to an optical or infra-red carrier whereby data is transmitted between circuits, wherein each circuit has clock means whereby synchronisation of all the circuits is achieved, wherein each circuit has one or more photodetector inputs, and wherein the inputs of each circuit are controlled by the clock means such that each said input is enabled only for a respective time slot of a received multiplexed signal.

According to a further aspect of the invention there is provided a method of transmitting a plurality of signals from a first to a second integrated circuit, said method including generating an optical or infra-red carrier, modulating said carrier with said signals in a time division multiplex manner, and receiving and demodulating said carrier on said second circuit.

The signals may be conducted between the circuits via optical fibres, via a suitable waveguide, or in some applications via a free space path. The available bandwidth is extremely high and a very high modulation rate may be achieved. In particular the optical pulse shape is substantially independent of path length whereas an electrical connection increasingly degrades pulse rise and fall times with increasing path length due to the inherent RC product. Only a single output pad is required in contrast to conventional electrical coupling systems.

An embodiment of the invention will now be described with reference to the accompanying drawings in which the single figure is a schematic diagram of a pair of integrated circuits coupled via an optical signal path.

Referring to the drawing, first (11) and second (12) integrated circuit devices, which may for example form part of a larger assembly comprising a computer or a telephone exchange, are coupled each to optical data highways 13a and 13. Each circuit device has an output pad 14, 14a whereby output signals from outputs 21, 21a of digital integrated circuits 22, 22a are coupled to a light emitting diode 15, 15a. This diode may be mounted on a common substrate or chip carrier adjacent the circuit device or it may be integrated on the chip itself. In the latter case a diode material that is lattice matched to the chip should be employed. If for example a silicon chip is employed then a suitable diode material is zinc sulphide. Gallium arsenide chips may of course be provided with gallium arsenide based diodes. Each pad 14, 14a is coupled via an electronic switch 16, 16a, controlled by a clock generator 23, 23a, to the signal outputs 21, 21a whereby signals generated at those outputs may be time division multiplexed to form a common output signal. This common output signal is superimposed or modulated on to an optical signal via the diode 15, 15a which optical signal is then coupled to the data highway 13, 13a via an input port 17, 17a.

Each circuit 11, 12 has a plurality of photodetectors 20, 20a each associated with a circuit input and controlled via the circuit clock such that each input is enabled only during its respective time slot. For clarity only one photodetector 20, 20a has been depicted on each circuit 11, 12. Incoming optical signals from the data highway 13 are received via an output port 19 from which the light is broadcast over the circuit such that all the photodetectors are illuminated. Each photodetector thus responds only to that portion of the optical signal intended for that particular circuit input.

It is not essential for the number of inputs and outputs to be equal. Thus in any particular arrangement the number of inputs may be greater than, less than or equal to the number of outputs.

In the particular arrangement shown in the drawing each of the two circuits transmits to the other. It will however be apparent that the technique is not limited to this particular arrangement and that transmission to and from remote circuits (not shown) is also envisaged. Furthermore, although a guided transmission system is shown this may, in some applications, be replaced by free space transmission between adjacent circuits.

By time multiplexing all the output ports of an integrated circuit to a common pad and thence to a single light emitting diode a high data transmission rate has to be accommodated. However this is no disadvantage as the optical transmission technique provides a very large bandwidth.

Unlike conventinal wired systems the data pulses suffer substantially no degradation in shape during transmission between circuits. Furthermore there are no problems of impedance matching thus obviating the need for input and output buffer amplifiers. The high frequency of the light signal allows the simultaneous transmission of a large number of signals. For example, in a typical arrangement 50 outputs having bit rates of 5 Mbit/s may be multiplexed using a 250 M Hz communication rate.

It will be apparent that in return for the small added complexity arising from the adoption of time division multiplexing a single output structure requiring only one light emitting device per chip is achieved. Further, it is not necessary to provide a guiding structure for accessing the multiple input connections to the chip.

The major modification to the integrated circuit to implement the technique is the provision of commutated switching to selectively connect the output points of the circuit to the common output pad and to gate the photodetector inputs of the circuit in the required synchronism to effect the particular input connection pattern. This requires a clock generator on each chip running at the commutation rate. Typically this is provided by a master clock on one chip controlling slave generators on the other chips forming the system.

In the preferred configuration the signal delay time between chips is less than the clock period and the system can thus be operated in absolute synchronism. In other arrangements where delays are significant it is necessary to provide buffers on each chip, each buffer being adaptively controlled to synchronize with the received data stream.

In some applications where there are a range of data rates at the different input and output connection points it is necessary to provide sorting logic to minimise the commutation rate less than the product of the number of output and input points and the maximum data rate.

The light source is solid state and may be a laser, LED or an electroluminescent element. Semiconductor diode sources have the capability for drive modulation rates up to 1 GHz and lasers have the capability for considerably higher modulation rates. In any particular configuration the source power required depends inter alia on the chip fan-out, losses in transmission, the modulation rate, the area of chip to be illuminated and the size of the photodetectors. The necessary calculation to take account of these factors will be apparent to those skilled in the art. A preferred mounting for the light source is adjacent the chip on a common chip support substrate. The commutated output pad may be connected to the source by a stitchbond, optionally via a buffer amplifier. The source is aligned with the input fibre to the optical bus harness, the input point being securely mounted adjacent the chip. The spectrum of the light is not critical but it should contain wavelengths, e.g. less than 1 micron, that are strongly absorbed in silicon.

As loss and dispersion are not significant for the relatively short interconnection lengths required in this technique a large cross-section plastics multimode fibre may be used as the bus. Advantageously the input and output fibre ends to and from the bus have lens terminations 25, 26, 25a, 26a.

The photodetector may comprise an avalanche, photoconductive or PIN device and, advantageously, is monolithically integrated on the integrated circuit chip.

The arrangements described herein are particularly suitable for use in a telephone exchange or a digital computer. They are however not so limited and may of course be used in other applications where it is necessary to interchange a high volume of digital signal traffic between integrated circuits.

We claim:

1. An integrated circuit device including a digital integrated circuit having a plurality of electrical signal outputs and inputs,
   switch means whereby said outputs are coupled selectively to a common output pad in a time division multiplex sequence,
   clock means connected to the switch means and to the circuit inputs whereby the switch means is controlled to effect said sequence and whereby the inputs are enabled in synchronism with said sequence, and
   a light or infrared source coupled to the common output whereby, in use, the multiplexed output signal is modulated on to an optical or infrared carrier for transmission to the inputs of similar circuit devices,
   wherein each said circuit input is coupled to a respective photodetector whereby the optical signal is applied to that input, and
   wherein, in use, said inputs are so controlled by the clock means that each said input is selectively enabled only for a respective time slot of a multiplexed signal received from similar circuit devices.

2. A circuit device as claimed in claim 1, wherein said light source comprises a laser or a light emitting device diode mounted on a common substrate carrier adjacent the circuit.

3. A circuit device as claimed in claim 2, wherein said light source comprises a material lattice matched to the circuit device material.

4. A circuit or circuit device as claimed in claim 3, wherein the circuit is of silicon and the light source is a zinc sulphide diode.

5. A circuit or circuit device as claimed in claim 3, wherein the circuit is of gallium arsenide and the light source is a gallium arsenide based diode.

6. A digital circuit assembly including:
   an array of integrated circuits each having a clock generator and a plurality of electrical outputs coupled via switch outputs controlled by the clock generator and coupled to a common optical output on that circuit whereby the electrical outputs are time division multiplexed (TDM) on to said optical output for transmission to other circuits of the array;
   wherein each said circuit has a plurality of inputs each coupled to a respective photodetector;
   wherein the inputs of each said circuit are so controlled via the clock generator that each input is selectively enabled only for a respective time slot of the TDM cycle; and
   wherein the assembly is such that optical or infrared signals from said optical outputs are transmitted via a common transmission medium to the photodetectors associated with the inputs of said circuits.

7. A circuit assembly as claimed in claim 6, and including optical waveguide means whereby the optical or infrared signals are transmitted between circuits.

8. A circuit assembly as claimed in claim 7, wherein said waveguide has output lens terminations whereby the received optical or infra-red signals are broadcast over each circuit.

9. A circuit assembly as claimed in claim 8, wherein said waveguide comprises a multimode optical fibre.

* * * * *